(12) United States Patent
Yano

(10) Patent No.: US 6,864,941 B2
(45) Date of Patent: Mar. 8, 2005

(54) DISPLAY APPARATUS CHARACTERIZED BY WIRING STRUCTURE

(75) Inventor: Takakazu Yano, Tokyo (JP)

(73) Assignee: Citizen Watch Co., Ltd., Nishitokyo (JP)

( * ) Notice: Subject to any disclaimer, the term of this patent is extended or adjusted under 35 U.S.C. 154(b) by 97 days.

(21) Appl. No.: 10/253,525

(22) Filed: Sep. 25, 2002

(65) Prior Publication Data

US 2003/0058398 A1 Mar. 27, 2003

(30) Foreign Application Priority Data

Sep. 27, 2001 (JP) .......................................... 2001-295248

(51) Int. Cl.⁷ .............................................. G02F 1/1345
(52) U.S. Cl. ...................................... 349/149; 349/152
(58) Field of Search ................................... 349/149–152

(56) References Cited

U.S. PATENT DOCUMENTS 5,576,868 A 11/1996 Togashi ........................ 359/99
6,323,930 B1 * 11/2001 Higuchi et al. ............. 349/152
6,686,987 B1 * 2/2004 Sakaki et al. ............... 349/149

FOREIGN PATENT DOCUMENTS

JP 01084298 A 3/1989
JP 11338438 A 10/1999

* cited by examiner

Primary Examiner—Dung T. Nguyen
(74) Attorney, Agent, or Firm—Finnegan, Henderson, Farabow, Garrett & Dunner, L.L.P.

(57) ABSTRACT

In a display apparatus, a display device and an integrated circuit for driving the display device are mounted on the same substrate and are interconnected by electrodes formed on the substrate, and the substrate is connected to an external circuit by a flexible printed circuit, wherein the integrated circuit has a rectangular shape whose first side is provided with a first output terminal group and whose second side opposite the first side is provided with an input terminal group and a second output terminal group. Further, some of the output terminals in the second output terminal group provided on the second side of the integrated circuit are designated as unconnected terminals that are not used, and an input electrode group corresponding to the input terminal group is formed in such a manner as to expand into an output electrode formation area originally reserved on the substrate for the unconnected terminals.

20 Claims, 8 Drawing Sheets

DISPLAY APPARATUS CHARACTERIZED BY WIRING STRUCTURE

CROSS-REFERENCE TO RELATED APPLICATION

This application claims priority from Japanese Patent Application No. 2001-295248, filed on Sep. 27, 2001.

BACKGROUND OF THE INVENTION

1. Field of the Invention

The present invention relates to a display apparatus in which a display device and an integrated circuit for driving the display device are mounted on the same substrate, wherein the substrate is connected to an external circuit by a flexible printed circuit.

2. Prior Art

Nowadays, many portable apparatuses, such as portable telephones, are equipped with a display apparatus comprising a display device, such as a liquid crystal display device, and an integrated circuit for driving the display device. In such a display apparatus, however, as the number of terminals on the display device increases, it becomes difficult to drive the display device by a single integrated circuit, and therefore, it is practiced to drive the display device by using a plurality of integrated circuits, as disclosed in prior art such as Japanese Unexamined Patent Publication No. 11-338438.

When driving a display apparatus by using a plurality of integrated circuits as described above, it is preferable, from the standpoint of design, to use integrated circuits having output terminals the number of which is chosen to match the number of terminals on the display device, that is, custom integrated circuits. This, however, leads to the problem that the cost increases because the custom integrated circuits must be designed and fabricated to match the number of terminals on the display device to be used. It is therefore practiced, as in the above prior art, to reduce the cost by employing general-purpose integrated circuits each having a predetermined number of output terminals and by choosing the number of such integrated circuits so that the total number of their output terminals exceeds the number of output terminals on the display device. In this case, as the total number of output terminals on the plurality of integrated circuits naturally becomes larger than the number of terminals on the display device, various methods are used to handle the terminals that are not brought out and used for driving the display device.

On the other hand, to meet the needs for smaller and lighter portable apparatuses in which a display apparatus such as described above is to be mounted, process improvements have been made in general-purpose integrated circuits, and high-performance and low-cost integrated circuits have been achieved by increasing the number of outputs while achieving a reduction in overall size. As a result, while conventional general-purpose integrated circuits have a structure such that the output terminals are formed only on one longer side (hereinafter called the first side) of the rectangular chip and the input terminals on the other longer side (hereinafter called second side) opposite the first side, small and multi-output integrated circuits have been commercially implemented that have output terminals not only on the first side but also on the second side on which the input terminals are formed, thereby increasing the total number of output terminals.

Referring to drawings, a description will be given below of how the integrated circuit terminals not brought out for connection are handled in a display apparatus constructed using general-purpose integrated circuits that have output terminals on the second side also. The following description is given for the case of a liquid crystal display apparatus which uses a liquid crystal display device as the display device.

FIG. 5 is a diagram showing the wiring structure of the liquid crystal display apparatus that employs a packaging technique known as tape-automated bonding (TAB) in which small, multi-output general-purpose integrated circuits, such as those described above, are mounted on flexible printed circuits (hereinafter called the FPCs) provided separately from the common substrate. First, the construction of the liquid crystal display apparatus will be described. The liquid crystal display apparatus comprises a printed circuit board 422 (hereinafter called the PCB) on which a signal generating circuit and power supply circuit (neither shown here) for driving the liquid crystal display are mounted, a first FPC 420 on which a first integrated circuit 409 is mounted, a second FPC 421 on which a second integrated circuit 410 is mounted, a third FPC 419, and a liquid crystal display device 435 constructed by injecting a liquid crystal between a device substrate (hereinafter called the first substrate) 418 and the common substrate (hereinafter called the second substrate) 434. Thin-film transistor (TFT) devices are formed on the first substrate 418, and a whole-area electrode is formed in a display area 430 on the second substrate 434. Many commercially implemented liquid crystal display apparatuses have high-resolution display capabilities (for example, 640 columns by 240 rows) but, for simplicity of explanation,-the following description assumes that the display apparatus has a matrix structure of 70 columns and 20 rows.

The first FPC 420, second FPC 421, and third FPC 419 as connecting boards are connected to the PCB 422 as an external circuit by crimp contacts. The first FPC 420, second FPC 421, and third FPC 419 are attached to the first substrate 418 by thermal compression using an anisotropic conductive sheet (ACS) formed by mixing conductive particles in an insulating adhesive sheet.

The first FPC 420 has the function of transferring signals generated by the signal generating circuit and power generated by the power supply circuit from the PCB 422 to the first integrated circuit 409 and transferring outputs of the first integrated circuit 409 to the first substrate 418. The second FPC 421 has the function of transferring signals generated by the signal generating circuit and power generated by the power supply circuit from the PCB 422 to the second integrated circuit 410 and transferring outputs of the second integrated circuit 410 to the first substrate 418. The third FPC 419 has the function of transferring signals generated by the signal generating circuit and power generated by the power supply circuit from the PCB 422 to the third integrated circuit 417 and transferring outputs of the third integrated circuit 417 to the first substrate 418.

The liquid crystal display device 435 is supplied with data signals from the first integrated circuit 409 and second integrated circuit 410 and a scanning signal from the third integrated circuit 417, and displays an image in the display area 730 by driving the matrix of 70 columns and 20 rows in time-division line sequential fashion (multiplex driving).

As earlier described, the first integrated circuit 409 and the second integrated circuit 410 are general-purpose integrated circuits that have output terminals on the side thereof on which the input terminals are also provided. These integrated circuits 409 and 410, with their gold-plated or soldered electrode side facing down, are attached to the first FPC 420 and the second FPC 421, respectively, by thermal compression using an anisotropic conductive sheet (ACS) (this mounting method is called tape-automated bonding (TAB)). In actual commercialized versions of the first integrated circuit 409 and the second integrated circuit 410, the number of output terminals formed on the side (second side) on which the input terminals are provided is 20 or more on each of the right and left sides of the input terminals, but for simplicity of explanation, the following description assumes that there are four output terminals to the left of the input terminals and 12 to the right.

The wiring will be described in detail below. A first power supply line group 401 is used to supply power, ground (0 V potential) and +5 V potential, for driving the first integrated circuit 409 and the second integrated circuit 410. A first data signal line group 400, which is used for transferring a signal group representing grayscale, consists of four data lines, that is, the zeroth bit data line, the first bit data line, the second bit data line, and the third bit data line. A clock signal line 403 is used for transferring a signal that defines the timing for reading the signals transferred via the first data signal line group 400.

A start signal line 423 is used for transferring a start signal that defines the timing for starting the reading into the first integrated circuit 409 of the data signal group transferred via the first data signal line group 400. A first cascade signal line 405 is used for transferring a cascade signal, which occurs when the data read to the first integrated circuit 409 is completed, to the second integrated circuit 410 as a signal that defines the timing for starting the reading of the data signal group transferred via the first data signal line group 400. A latch signal line 402 is used for transferring a latch signal that defines the timing for causing the data loaded into the first integrated circuit 409 and the second integrated circuit 410 to be output. A second cascade signal line 425 is provided to transfer a cascade signal, which occurs when the data read to the second integrated circuit 410 is completed, to the next integrated circuit as a signal that defines the timing for starting the reading of the data signal group transferred via the first data signal line group 400, but, in the liquid crystal display apparatus shown in FIG. 5, as there is no further integrated circuit, the second cascade signal line 425 is not connected to any electrode on the PCB 422. (In FIG. 5, the mark x attached to the second cascade signal line 425 indicates that the line is not connected to any electrode on the PCB 422.)

A first output line group 431 indicates a plurality of output wiring lines formed along the side (second side) on which the input terminals of the first integrated circuit 409 are provided, and output signals for the first to fourth columns, as viewed from the side on which the third integrated circuit 417 is mounted, are transferred via these output wiring lines to the corresponding electrodes (not shown) formed on the first substrate 418. A second output line group 411 indicates a plurality of output wiring lines formed along the side (first side) opposite the side on which the input terminals of the first integrated circuit 409 are provided, and output signals for the fifth to 32nd columns, as viewed from the side on which the third integrated circuit 417 is mounted, are transferred via these output wiring lines to the corresponding electrodes (not shown) formed on the first substrate 418. A third output line group 412 indicates a plurality of output wiring lines formed along the side (second side) on which the input terminals of the first integrated circuit 409 are provided, and output signals for the 33rd to 44th columns, as viewed from the side on which the third integrated circuit 417 is mounted, are transferred via these output wiring lines to the corresponding electrodes (not shown) formed on the first substrate 418.

A fourth output line group 413 indicates a plurality of output wiring lines formed along the side (second side) on which the input terminals of the second integrated circuit 410 are provided, and output signals for the 45th to 48th columns, as viewed from the side on which the third integrated circuit 417 is mounted, are transferred via these output wiring lines to the corresponding electrodes (not shown) formed on the first substrate 418. A fifth output line group 414 indicates a plurality of output wiring lines formed along the side (first side) opposite the side on which the input terminals of the second integrated circuit 410 are provided, and output signals for the 49th to 70th columns, as viewed from the side on which the third integrated circuit 417 is mounted, are transferred via these output wiring lines to the corresponding electrodes (not shown) formed on the first substrate 418.

A sixth output line group 432 indicates a plurality of output wiring lines formed along the side (first side) opposite the side on which the input terminals of the second integrated circuit 410 are provided; these output wiring lines are originally provided for transferring output signals for the 71st to 76th columns as viewed from the side on which the third integrated circuit 417 is mounted, but actually these output lines are not connected to any electrodes on the first substrate 418, as the total number of columns is 70 according to the specification of the liquid crystal display apparatus shown here. (In FIG. 5, the mark x attached to the sixth output line group 432 indicates that these output lines are not connected to any electrodes on the first substrate 418.) A seventh output line group 408 indicates a plurality of output wiring lines formed along the side (second side) on which the input terminals of the second integrated circuit 410 are provided; these output wiring lines are provided for transferring output signals for the 77th to 88th columns as viewed from the side on which the third integrated circuit 417 is mounted but, actually, these output lines, like those in the output line group 432, are not connected to any electrodes on the first substrate 418, because the total number of columns is 70 according to the specification of the liquid crystal display apparatus shown here. (In FIG. 5, the mark x attached to the seventh output line group 408 indicates that these output lines are not connected to any electrodes on the first substrate 418.)

The third integrated circuit 417 is mounted on the first substrate 418 by using the so-called chip-on-glass technique, that is, by thermal compression using an ACF. The third integrated circuit 417 has the function of sequentially outputting scanning signals in response to signals input via the third FPC 419. An actual commercialized version of the third integrated circuit 417 is usually provided with 120 or more output terminals, but for simplicity of explanation, the following description assumes that it is provided with 20 output terminals.

A second power supply line group 406 is used to supply power of ground (0 V potential), +5 V, −15 V, and +15 V for driving the third integrated circuit 417. A second data signal line group 407 is used for transferring a frame start signal and a row clock signal to be input to the third integrated circuit 417. The row clock signal is a signal for defining the timing of row selection, while the frame start signal indicates the timing for selecting the first row. Scanning electrodes 416 are 20 electrodes formed on the first substrate 418 to sequentially select the rows in the liquid crystal display device 435. When the frame start signal is input, the third integrated circuit 417 sequentially selects the scanning electrodes 416 from the top to the bottom at the rising edge of the clock signal. A base signal line 436 is used for transferring to the second substrate 434 the power that defines the potential of the whole-area electrode of the second substrate 434 necessary for TFT operation. The meanings of the power supply potential and base potential for the third integrated circuit 417 are the same as those used for ordinary TFT operation, and will not be described here since they have little relevance to the present invention.

Next, the operation of the first integrated circuit 409 and the second integrated circuit 410 will be described. When the signal from the start signal line 423 is input, the first integrated circuit 409 reads the data signals on the first data signal line group 400 in synchronism with the signal rise timing of the clock line 403. When the reading of the data signals (data for the first to 44th columns) for 44 outputs, the maximum number of outputs, is completed, a cascade signal is output on the first cascade signal line 405. When the cascade signal from the first cascade signal line 405 is input, the second integrated circuit 410 reads the data signals on the first data signal line group 400 (data for the 45th to 70th columns) in synchronism with the signal rise timing of the clock line 403.

In this way, an image formed from 70 columns and 20 rows can be displayed in the display area of the liquid crystal display device. The configuration shown in FIG. 5 above is the same as the configuration disclosed in FIG. 37as a prior known example in the earlier cited prior art Japanese Unexamined Patent Publication No. 11-338438; here, all the terminals on the integrated circuit 409 are used, and the terminals not used (unconnected terminals) are all assigned to the integrated circuit 410. As a result, extra space is needed on the liquid crystal display apparatus for those unused terminals. When the invention disclosed in Japanese Unexamined Patent Publication No. 11-338438 is applied to the liquid crystal display apparatus shown in FIG. 5, a general-purpose integrated circuit is used as the integrated circuit 409 and all the output terminals thereof are used, while for the integrated circuit 410, a smaller-size integrated circuit having fewer output terminals is custom made, eliminating the need for an extra space on the liquid crystal display apparatus.

Next, the problem with the display apparatus of the prior known configuration shown in FIG. 5, in particular, the wiring structure for each integrated circuit, will be described in further detail with reference to FIGS. 6 and 7. The display apparatus shown in FIGS. 6 and 7 is a modified example of the display apparatus shown in FIG. 5; in the illustrated example, the display device and the integrated circuits for driving the display device are mounted on the first substrate by using a COG technique, and the first substrate is connected to an external circuit by a flexible printed circuit. FIG. 6 is a plan view of an essential portion showing a layout of electrode patterns on the first substrate, and FIG. 7 is an enlarged plan view showing the pattern layout for one integrated circuit.

In FIG. 6, of the two glass substrates forming the liquid crystal display device, the bottom substrate forming the first substrate 418' is a large-size substrate on which the two integrated circuits 409 and 410 and mounted and the electrode patterns formed; on the other hand, the top substrate forming the second substrate 435 is smaller in size and defines the display area 430. In the space between the display area 430 and one end side 204 of the first substrate 418' are mounted the small-size, multi-output general-purpose integrated circuits 409 and 410, each rectangular in shape, with their first sides 409a and 410a facing the display area 430 and second sides 409b and 410b facing the one end side 204.

On the first substrate 418' are patterned: an output electrode group Do1 connected to a first output terminal group To1 formed on the first side 409a, 410a of the integrated circuit 409, 410; output electrode groups Do2 and Do3 connected to a second output terminal group To2 and a third output terminal group To3, respectively, formed near the respective ends of the second side 409b, 410b; and an input electrode group Di connected to an input terminal group Ti formed on the center portion of the second side.

Further, as shown in FIG. 7, routing electrode portions Dh2 and Dh3 are patterned via which the output electrode groups Do2 and Do3 connected to the second output terminal group To2 and third output terminal group To3 formed on the second side 409b of the integrated circuit 409 are routed to the same side as the first side; on the other hand, the input electrode group Di has a narrow portion Dis, which is connected to the input terminal group Ti, and a wide portion Diw, which is connected to connecting electrodes on the flexible printed circuit.

FIG. 8 is an enlarged plan view of the input electrode group Di shown in FIG. 7; as shown, in the narrow portion Dis, each pattern width 203 is 10 $\mu$m and the gap 203g is 10 $\mu$m, while the first to ninth input electrodes 221 to 229 in the wide portion Diw require a relatively large pattern width and gap in order to provide reliable electrical connections between the input electrode group Di and the respective electrodes (not shown) on the FPC 131 while preventing leakage between the patterns. In the illustrated example, about 300 $\mu$m must be provided for the pattern width 201 and 100 $\mu$m for the gap 202.

As described above, when designing a small-size display apparatus by using small-size, multi-output integrated circuits each having output terminals also on the second side on which the input terminals are provided, and by mounting these integrated circuits on the common substrate of a liquid crystal display device or the like, it is generally practiced to assign the unused, and hence unconnected, terminal group Tnc to one particular integrated circuit (410), while using all the terminals on the other integrated circuit (409), as shown in FIGS. 5 to 7. This arrangement, however, requires an extra space on the common substrate to accommodate the wide portions of the input terminals of the integrated circuit, and the provision of such space makes it difficult to reduce the size of the display apparatus.

That is, as the electrode patterns on the second side 409b of the integrated circuit 409 are formed along the entire length of the second side as shown in FIG. 7, the space for forming the wide portion Diw of the input electrode group Di cannot be secured between the second and third output terminal groups To2 and To3. As a result, the wide portion Diw of the input electrode group Di must be formed outside a formation range L2' in which the routing electrodes Dh2 and Dh3 are formed, and hence, the distance Li' from the second side 409b of the integrated circuit 409 to the one end side 204 of the first substrate 418' increases, making it difficult to reduce the size of the display apparatus. Furthermore, as electrodes are brought out for all the terminals in the third output terminal group To3 of the integrated circuit 409a, the length L2' necessary for routing these electrodes to the display device increases in proportion to the number of output terminals.

SUMMARY OF THE INVENTION

It is an object of the present invention to solve the above problem of the prior art apparatus and provide a wiring structure that can promote the construction of a smaller-size display apparatus.

To achieve the above object, according to the present invention, there is provided a display apparatus in which a display device and an integrated circuit for driving the display device are mounted on the same substrate and are interconnected by electrodes formed on the substrate, and the substrate is connected to an external circuit by a flexible printed circuit, wherein the integrated circuit has a rectangular shape whose first side is provided with a first output terminal group and whose second side opposite the first side is provided with an input terminal group and a second output terminal group, the display apparatus characterized in that: some of output terminals in the second output terminal group provided on the second side of the integrated circuit are designated as unconnected terminals that are not used, and an input electrode group corresponding to the input terminal group is formed in such a manner as to expand into an output electrode formation area originally reserved on the substrate for the unconnected terminals.

In the above display apparatus, as the output electrode formation area originally reserved on the substrate for the unconnected terminals can be used as an area for forming the input electrode group corresponding to the input terminal group, an area wide enough for the formation of the input electrode group can be secured on the same side as the second side of the integrated circuit. As a result, the length of the input electrode group can be reduced, thus allowing the size of the substrate to be reduced.

Further, a plurality of such integrated circuits are mounted on the substrate, and the integrated circuits each have a substantially identical terminal arrangement. As a result, an area wide enough for the formation of the input electrode group can be secured on the same side as the second side of each integrated circuit. Moreover, the input/output electrodes deposited on the substrate are formed in a pattern that is substantially identical between the plurality of integrated circuits. This contributes to reducing the length of the input electrode group to be formed on the substrate, and thus, a display apparatus more compact in size can be achieved.

When the above display device is applied to a liquid crystal panel, a compact liquid crystal display apparatus can be achieved.

DESCRIPTION OF THE PREFERRED EMBODIMENTS

The best mode for embodying the present invention in a liquid crystal display apparatus will be described below with reference to the drawings.

Figure 1:
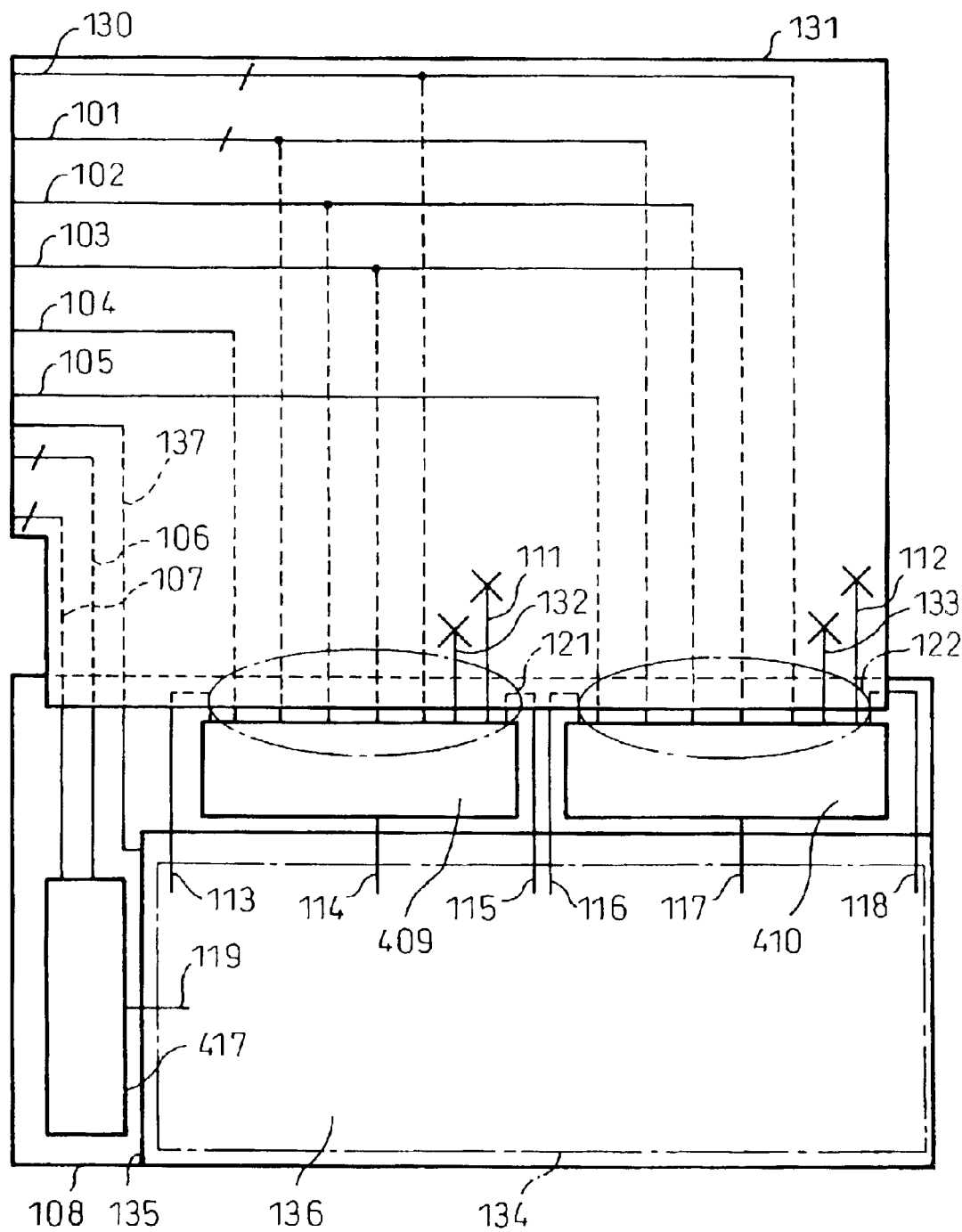
FIG. 1 is a schematic diagram for explaining the structure of a liquid crystal display apparatus according to an embodiment of the present invention.

FIG. 1 is a schematic diagram showing the structure of a liquid crystal display apparatus, in particular, wiring patterns, according to an embodiment of the present invention. First, the structure of the liquid crystal display apparatus shown in FIG. 1 will be described. The liquid crystal display apparatus comprises a PCB (not shown) on which a signal generating circuit and power supply circuit for driving the liquid crystal display are mounted (neither the signal generating circuit nor the power supply circuit are shown here), a FPC 131 for transferring signals from the PCB to the first integrated circuit 409, second integrated circuit 410, and third integrated circuit 417, a first substrate 108 on which the first integrated circuit 409, second integrated circuit 410, and third integrated circuit 417 are mounted by means of COG, a second substrate 135, and a liquid crystal display device 136 constructed by injecting a liquid crystal between the first substrate 108 and the second substrate 135. Thin-film transistor (TFT) devices are formed on the first substrate 108, and a transparent electrode is formed over the entire display area 134 on the second substrate 135. An actual commercialized version of this liquid crystal display apparatus has a high-resolution display capability (for example, 640 columns by 240 rows) but, for simplicity of explanation, the following description assumes that the display apparatus has a display area of 70 columns by 20 rows.

The FPC 131 and the PCB (not shown but attached to the left side of the FPC 131) are connected by means of a crimp connector (not shown), while the FPC 131 and the first substrate 108 are connected by thermal compression using an anisotropic conductive sheet (ACS). The FPC 131 has the function of coupling signals generated by the signal generating circuit and power generated by the power supply circuit from the PCB to the first integrated circuit 409, second integrated circuit 410, and third integrated circuit 417, and of connecting the outputs of the respective integrated circuits 409, 410, and 417 to the first substrate 108.

The liquid crystal display device 136 is supplied with data signals from the first integrated circuit 409 and second integrated circuit 410 and a scanning signal from the third integrated circuit 417, and displays an image in the display area 134 by driving the matrix of 70 columns and 20 rows in time-division line sequential fashion (multiplex driving).

The first integrated circuit 409 and the second integrated circuit 410 are each an integrated circuit of the type that has output terminals on the input terminal mounted side as well, and are mounted on the first substrate 108 by using the so-called COG technique, that is, by thermal compression using an anisotropic conductive sheet. In actual commercialized versions of the first integrated circuit 409 and the second integrated circuit 410, the number of output terminals formed on the side on which the input terminals are provided is 20 or more on each of the right and left sides of the input terminals, but for simplicity of explanation, the following description assumes that there are four output terminals to the left of the input terminals and 12 to the right. It is also assumed that these integrated circuits are each provided with 28 output terminals on the side opposite to the input terminal mounted side, which means that each integrated circuit has a total of 44 output terminals.

The wiring will be described in detail below. A first power supply line group 101 comprises power supplies of ground (0 V potential) and +5 V potential for driving the first integrated circuit 409 and the second integrated circuit 410. A data signal line group 130, which is used for transferring a signal group defining the grayscale of the first integrated circuit 409 and second integrated circuit 410, consists of four data lines, that is, the zeroth bit data line, the first bit data line, the second bit data line, and the third bit data line. A clock signal line 103 is used for transferring a signal that defines the timing for reading the signals transferred via the data signal line group 130.

A first start signal line 104 is used for transferring a start signal that defines the timing for staring the reading into the first integrated circuit 409 of the data signal group transferred via the data signal line group 130. A second start signal line 105 is used for transferring a signal that defines the timing for starting the reading into the second integrated circuit 410 of the data signal group transferred via the data signal line group 130. A latch signal line 102 is used for transferring a latch signal that defines the timing for causing the data loaded into the first integrated circuit 409 and the second integrated circuit 410 to be output. A first cascade signal line 132 is provided to transfer a cascade signal, which occurs when the reading of the data corresponding to the number of outputs on the first integrated circuit 409 is completed, to the second integrated circuit 410 as a signal that defines the timing for starting the reading of the data signal group transferred via the data signal line group 130 but, as the second start signal 105 is supplied as the start signal to the second integrated circuit 410, the first cascade signal line 132 is not connected. (In FIG. 1, the mark x attached to the first cascade signal line 132 indicates that the line is not connected to any electrode on the FPC 131.) A second cascade signal line 133 is provided to transfer a cascade signal, which occurs when the reading of the data corresponding to the number of outputs on the second integrated circuit 410 is completed, to the next integrated circuit as a signal that defines the timing for starting the reading of the data signal group transferred via the data signal line group 130 but, as there is no further integrated circuit, the second cascade signal line 133 is not connected. (In FIG. 1, the mark x attached to the second cascade signal line 133 indicates that the line is not connected to any electrode on the FPC 131).

A first output line group 113 indicates a plurality of electrode output wiring lines on the first substrate 108 that are formed along the side on which the input terminals of the first integrated circuit 409 are provided, and that transfer output signals for the first to fourth columns as viewed from the side on which the third integrated circuit 417 is mounted. A second output line group 114 indicates a plurality of electrode output wiring lines on the first substrate 108 that are formed along the side opposite the side on which the input terminals of the first integrated circuit 409 are provided, and that transfer output signals for the fifth to 32nd columns as viewed from the side on which the third integrated circuit 417 is mounted. A third output line group 115 indicates a plurality of electrode output wiring lines on the first substrate 108 that are formed along the side on which the input terminals of the first integrated circuit 409 are provided, and that transfer output signals for the 33rd to 35th columns as viewed from the side on which the third integrated circuit 417 is mounted.

A fourth output line group 116 indicates a plurality of electrode output wiring lines on the first substrate 108 that are formed along the side on which the input terminals of the second integrated circuit 410 are provided, and that transfer output signals for the 36th to 39th columns as viewed from the side on which the third integrated circuit 417 is mounted. A fifth output line group 117 indicates a plurality of electrode output wiring lines on the first substrate 108 that are formed along the side opposite the side on which the input terminals of the second integrated circuit 410 are provided, and that transfer output signals for the 40th to 67th columns as viewed from the side on which the third integrated circuit 417 is mounted. A sixth output line group 118 indicates a plurality of electrode output wiring lines on the first substrate 108 that are formed along the side on which the input terminals of the second integrated circuit 410 are provided, and that transfer output signals for the 68th to 70th columns as viewed from the side on which the third integrated circuit 417 is mounted.

A first unconnected output electrode group 111 indicates a plurality of output wiring lines that are formed on the side opposite the side on which the output terminals of the first integrated circuit 409 are provided, and that are intended for transferring output signals for the 36th to 40th columns as viewed from the side on which the third integrated circuit 417 is mounted, but actually these wiring lines are not brought out for connection to the display area 134, because space has to be made available on the first substrate 108 to accommodate the input electrode pattern necessary for connection to the FPC 131. (In FIG. 1, the mark x attached to the first unconnected output electrode group 111 indicates that the corresponding electrodes on the first substrate 108 are not brought out for connection to the display area 134.)

A second unconnected output electrode group 112 indicates a plurality of output wiring lines that are formed on the side on which the input terminals of the second integrated circuit 410 are provided, and that are intended for transferring output signals for the 71st to 88th columns as viewed from the side on which the third integrated circuit 417 is mounted but, actually, these electrodes on the first substrate 108 are not brought out for connection to the display area 134, because the total number of columns is 70 according to the specification of the liquid crystal display apparatus shown here. (In FIG. 1, the mark x attached to the second unconnected output electrode group 112 indicates that the corresponding electrodes on the first substrate 108 are not brought out for connection to the display area 134.)

The third integrated circuit 417 has the function of sequentially outputting scanning signals in response to signals input via the FPC 131. An actual commercialized version of the third integrated circuit 417 is usually provided with 120 or more output terminals, but for simplicity of explanation, the following description assumes that it is provided with 20 output terminals.

A second power supply line group 106 comprises power supplies of ground (0 V potential), +5 V, −15 V, and +15 V for driving the third integrated circuit 417. A synchronization signal line group 107 comprises a frame start signal and a row clock signal to be input to the third integrated circuit 417. The row clock signal is a signal for defining the timing of row selection, while the frame start signal indicates the timing for selecting the first row. Scanning electrodes 119 are 20 electrodes formed on the first substrate 108 to sequentially select the rows in the liquid crystal display device 136. When the frame start signal is input, the third integrated circuit 417 sequentially selects the scanning electrodes 119 from the top to the bottom at the rising edge of the clock signal. A base signal line 137 is used for transferring, to the second substrate 135, the power that defines the potential of the whole-area electrode of the second substrate 135 necessary for TFT operation. The meanings of the power supply potential and base potential for the third integrated circuit 417 are the same as those used for ordinary TFT operation, and will not be described here since they have little relevance to the present invention.

Of the wiring lines shown on the FPC 131, those indicated by solid lines are the wiring lines formed on the front surface (the front side of the page), while those indicated by dotted lines are the wiring lines formed on the back surface (the reverse side of the page). Connections between the wiring lines on the front surface and the wiring lines on the back surface are made by contact holes usually used in an FPC fabrication process. A first integrated circuit input section 121 indicates an input area for the first integrated circuit 409, and a second integrated circuit input section 122 indicates an input area for the second integrated circuit 410.

Next, the operation of the first integrated circuit 409 and the second integrated circuit 410 will be described. When the signal from the first start signal line 104 is input, the first integrated circuit 409 reads the data signals on the data signal line group 130 in synchronism with the signal rise timing of the clock line 103. When the reading of the data signals (data for the first to 44th columns) for 44 outputs, the maximum number of outputs, is completed, a cascade signal is output on the first cascade signal line 132. When the start signal from the second start signal line 105 is input, the second integrated circuit 410 reads the data signals on the data signal line group 130 (data for the 36th to 70th columns) in synchronism with the signal rise timing of the clock line 103.

The first integrated circuit 409 and the second integrated circuit 410 output signals on the first output line group 113, second output line group 114, third output line group 115, fourth output line group 116, fifth output line group 117, and sixth output line group 118 by the rise timing of the latch signal on the latch signal line 102. The first unconnected output electrode group 111 and the second unconnected output electrode group 112 have no effect on the displayed image, as these electrodes are not brought out for connection to the display area.

In this way, an image formed from 70 columns and 20 rows can be displayed in the display area 134 of the liquid crystal display device 136.

Figure 2:
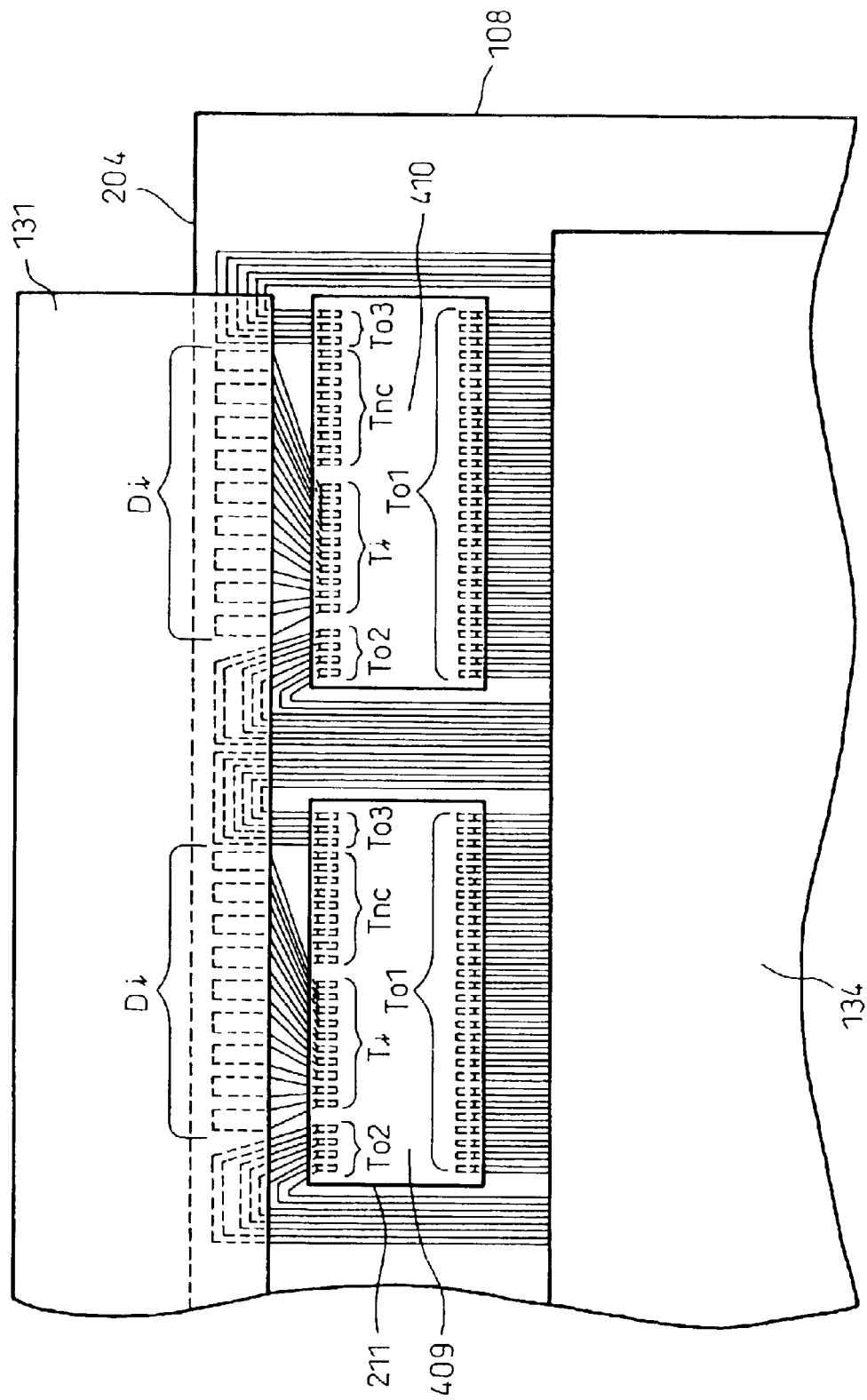
FIG. 2 is a diagram for explaining a layout for an input section of the liquid crystal display apparatus shown in FIG. 1.
Figure 3:
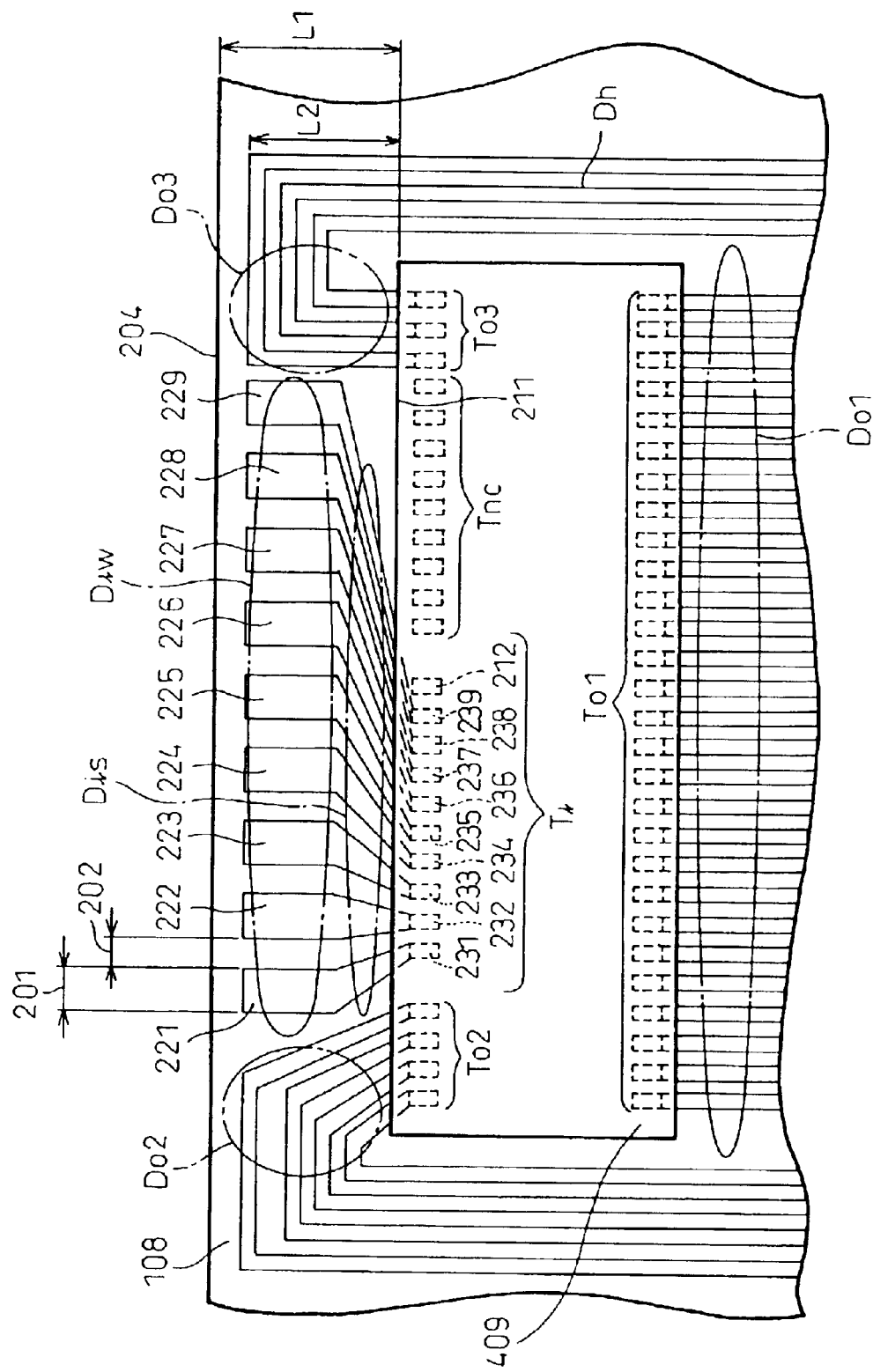
FIG. 3 is an enlarged view for explaining the layout for the input section of the liquid crystal display apparatus shown in FIG. 1.

Next, the actual electrode layout on the first substrate 108 will be described with reference to FIGS. 2 and 3. FIG. 2 is a diagram showing in enlarged form the layout of the electrode patterns formed on the first substrate 108 for the first integrated circuit 409 and second integrated circuit 410 shown in FIG. 1. FIG. 3 is a diagram showing, in further enlarged form, the electrode pattern layout for the integrated circuit 409 shown in FIGS. 1 and 2. In these figures, reference numeral 204 designates an edge face of the first substrate 108, and 211 indicates the integrated circuit external shape of the first integrated circuit 409.

As shown in detail in FIGS. 2 and 3, in the display apparatus of the present embodiment, the first output terminal group To1 is formed along the entire length of the first side 409a, 410a of the integrated circuit 409, 410, while the second output terminal group To2 is formed near the left end of the second side of the integrated circuit 409, 410 and the third output terminal group To3 near the right end. The input terminal group Ti of the integrated circuit 409, 410 is formed on the center portion of the second side. Reference character Tnc indicates the unused terminal group, that is, the unconnected terminal group. In the prior art, all the terminals in the unconnected terminal group Tnc have been concentrated on the final-stage integrated circuit, but in the present invention, they are divided equally between the integrated circuits 409 and 410. Accordingly, the unconnected terminal group Tnc originally belongs to the third output terminal group To3.

The second output terminal group To2 on the first integrated circuit 409 outputs signals for the first to fourth columns as viewed from the side on which the third integrated circuit 417 is mounted. The first output terminal group To1 on the first integrated circuit 409 outputs signals for the fifth to 32nd columns as viewed from the side on which the third integrated circuit 417 is mounted. The third output terminal group To3 on the first integrated circuit 409 outputs signals for the 33rd to 35th columns as viewed from the side on which the third integrated circuit 417 is mounted. The unconnected output terminal group Tnc on the first integrated circuit 409 outputs signals for the 36th to 44th columns as viewed from the side on which the third integrated circuit 417 is mounted, but the corresponding electrodes are not brought out for image display.

In the input terminal group Ti, the first input terminal 231 receives the first start signal, the second input terminal 232 receives the ground potential, the third input terminal 233 receives +5 V, the fourth input terminal 234 receives the latch signal, and the fifth input terminal 235 receives the clock signal. Further, the sixth input terminal 236 receives the zeroth bit data signal, the seventh input terminal 237 receives the first bit data signal, the eighth input terminal 238 receives the second bit data signal, and the ninth input terminal 239 receives the third bit data signal. On the other hand, the terminal 212 outputs a cascade signal, but the corresponding electrode is not brought out as this signal is not used.

The second electrode group Do2 is connected to the second output terminal group To2, and leads the output signals for the first to fourth columns, as viewed from the side on which the third integrated circuit 417 is mounted, into the display area 134. The first electrode group Do1 is connected to the first output terminal group To1, and leads the output signals for the fifth to 32nd columns, as viewed from the side on which the third integrated circuit 417 is mounted, into the display area 134. The third electrode group Do3 is connected to the third output terminal group To3, and leads the output signals for the 33rd to 35th columns, as viewed from the side on which the third integrated circuit 417 is mounted, into the display area 134.

Electrodes 221 to 229 are the electrodes connected to the input terminal group Ti; of these electrodes, the first electrode 221 connects the first start signal from the FPC 131 to the first input terminal 231, the second electrode 222 connects the ground potential from the FPC 131 to the second input terminal 232, the third electrode 223 connects +5 V to the third input terminal 233, the fourth electrode 224 connects the latch signal from the FPC 131 to the fourth input terminal 234, and the fifth electrode 225 connects the clock signal from the FPC 131 to the fifth input terminal 235. Further, the sixth electrode 226 connects the zeroth bit data signal from the FPC 131 to the sixth input terminal 236, the seventh electrode 227 connects the first bit data signal from the FPC 131 to the seventh input terminal 237, the eighth electrode 228 connects the second bit data signal from the FPC 131 to the eighth input terminal 238, and the ninth electrode 229 connects the third bit data signal from the FPC 131 to the ninth input terminal 239.

Figure 7:
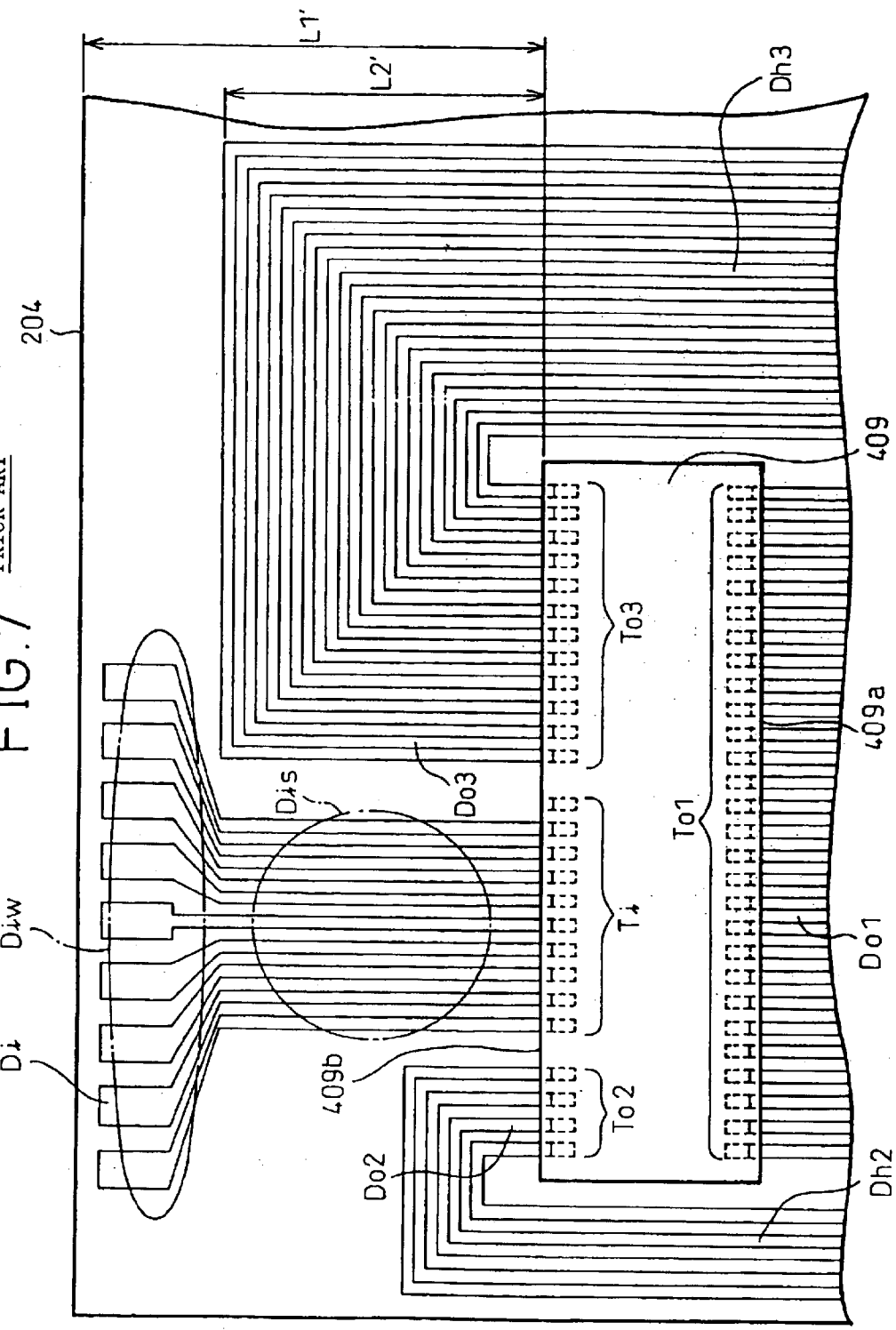
FIG. 7 is a diagram showing in enlarged form a portion of the display apparatus shown in FIG. 6.
Figure 8:
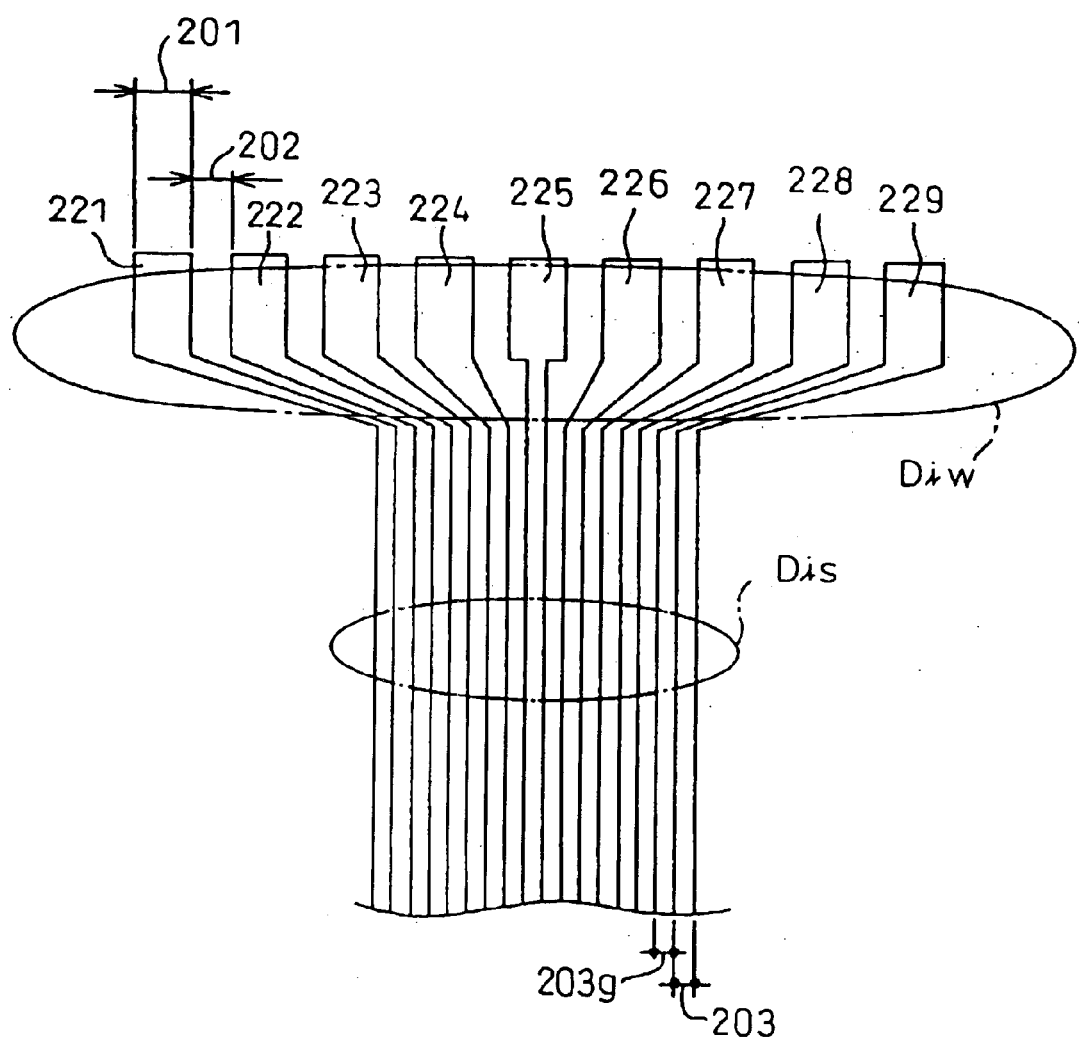
FIG. 8 is a diagram showing the structure of input electrodes in the display apparatuses shown in FIGS. 5 and 6.

A pattern width 201 (for example, 300 μm) for ensuring reliable electrical connection to the FPC 131 and a gap width 202 (for example, 100 μm) for preventing leakage between adjacent wiring patterns must be provided for the first to ninth input electrodes 221 to 229 (Di, see FIG. 2). As a result, the portion where the input electrode group connects to the FPC 131 becomes much wider than the wiring line formation area for the input terminal group Ti. In the present invention, as the unconnected terminal group Tnc is located between the input terminal group Ti and the third output terminal group To3, and no electrodes are formed for terminal group Tnc, the wide portion of the input electrode group can be formed by also utilizing the wiring line formation area originally provided for the unconnected terminal group Tnc. This allows the wide portion of the input electrode group to be formed in the space between the second electrode group Do2 and the third electrode group Do3, making it possible to reduce the length L1 of the area required for connection to the FPC 131. If electrodes were formed for the unconnected terminal group Tnc, it would not be possible to secure enough space for the wide portion of the input terminal group between the second electrode group Do2 and the third electrode group Do3, and the wide portion would have to be formed outside the output electrode formation area, as in the prior art shown in FIG. 7. In the case of the prior art, the length L1' is much longer than the length L1 in the case of the present invention. That is, L1<L1'. Further, if electrodes are formed for all the terminals in the third output terminal group To3, as shown in FIG. 7, the length L2' of the electrode group Do3, which has to be provided in the direction of the end face 204 in order to route the electrodes to the display device, increases in proportion to the number of electrodes to be formed. In contrast, in the apparatus of the present invention shown in FIGS. 2 and 3, as the number of electrodes in the third electrode group Do3 is reduced by providing the unconnected terminal group Tnc, L2 can be made smaller than L2', and the length L1 in the apparatus of the present invention, including the length L2, becomes much shorter than the length L1' in the prior art apparatus. This serves to greatly reduce the size of the first substrate 108.

Though the second integrated circuit input section 122 for the second integrated circuit 410 is not shown in FIG. 3, the electrode wiring layout is the same as that for the integrated circuit input section 121 described above. However, the electrodes on the integrated circuit 410 corresponding to the second electrode group Do2 of the integrated circuit 409 lead the output signals for the 36th to 39th columns, as viewed from the side on which the third integrated circuit 417 is mounted, into the display area 134, the electrodes corresponding to the first electrode group Do1 lead the output signals for the 40th to 67th columns, as viewed from the side on which the third integrated circuit 417 is mounted, into the display area 134, and the electrodes corresponding to the third electrode group Do3 lead the output signals for the 68th to 70th columns, as viewed from the side on which the third integrated circuit 417 is mounted, into the display area 134.

Figure 4:
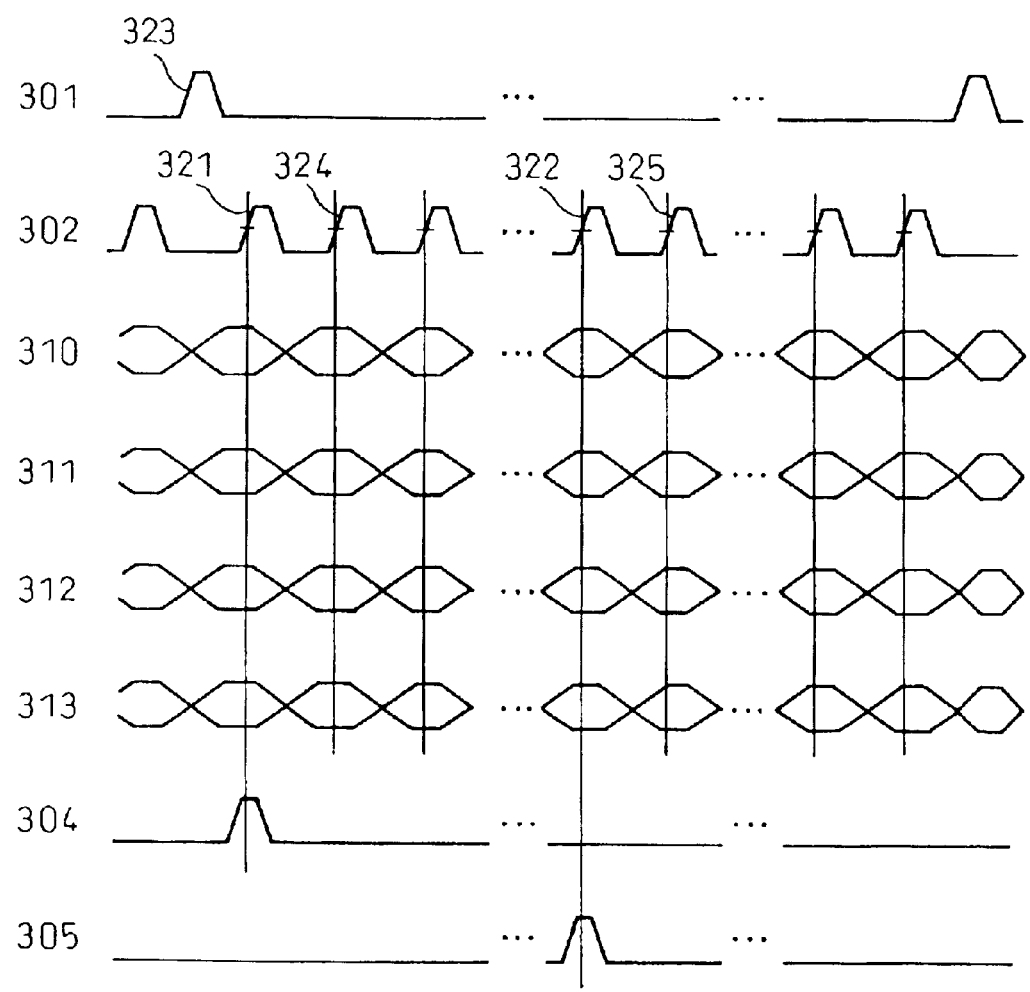
FIG. 4 is a waveform diagram showing the timing for driving the liquid crystal display apparatus according to the embodiment of the present invention.
Figure 5:
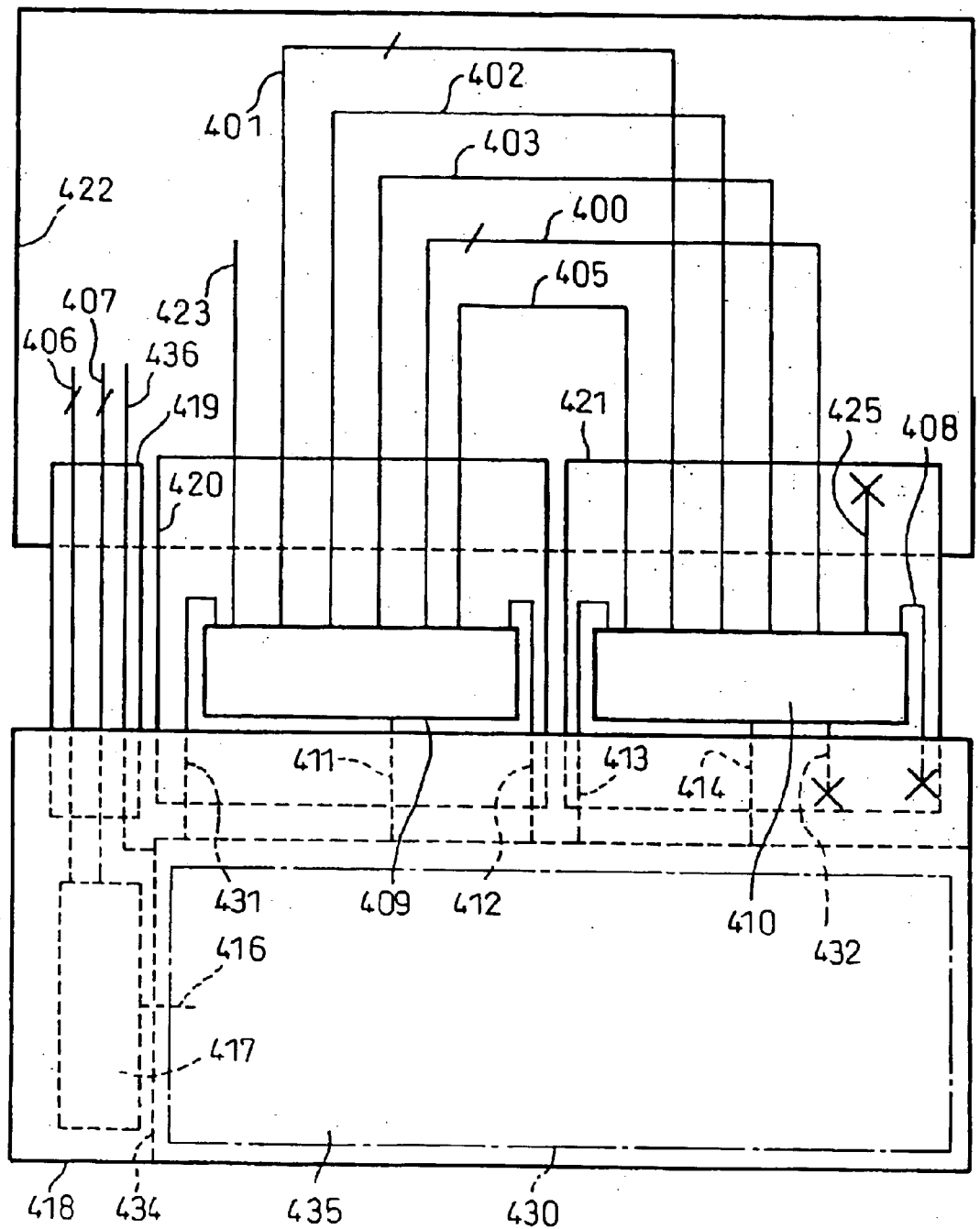
FIG. 5 is a schematic diagram for explaining the structure of a prior art liquid crystal display apparatus.
Figure 6:
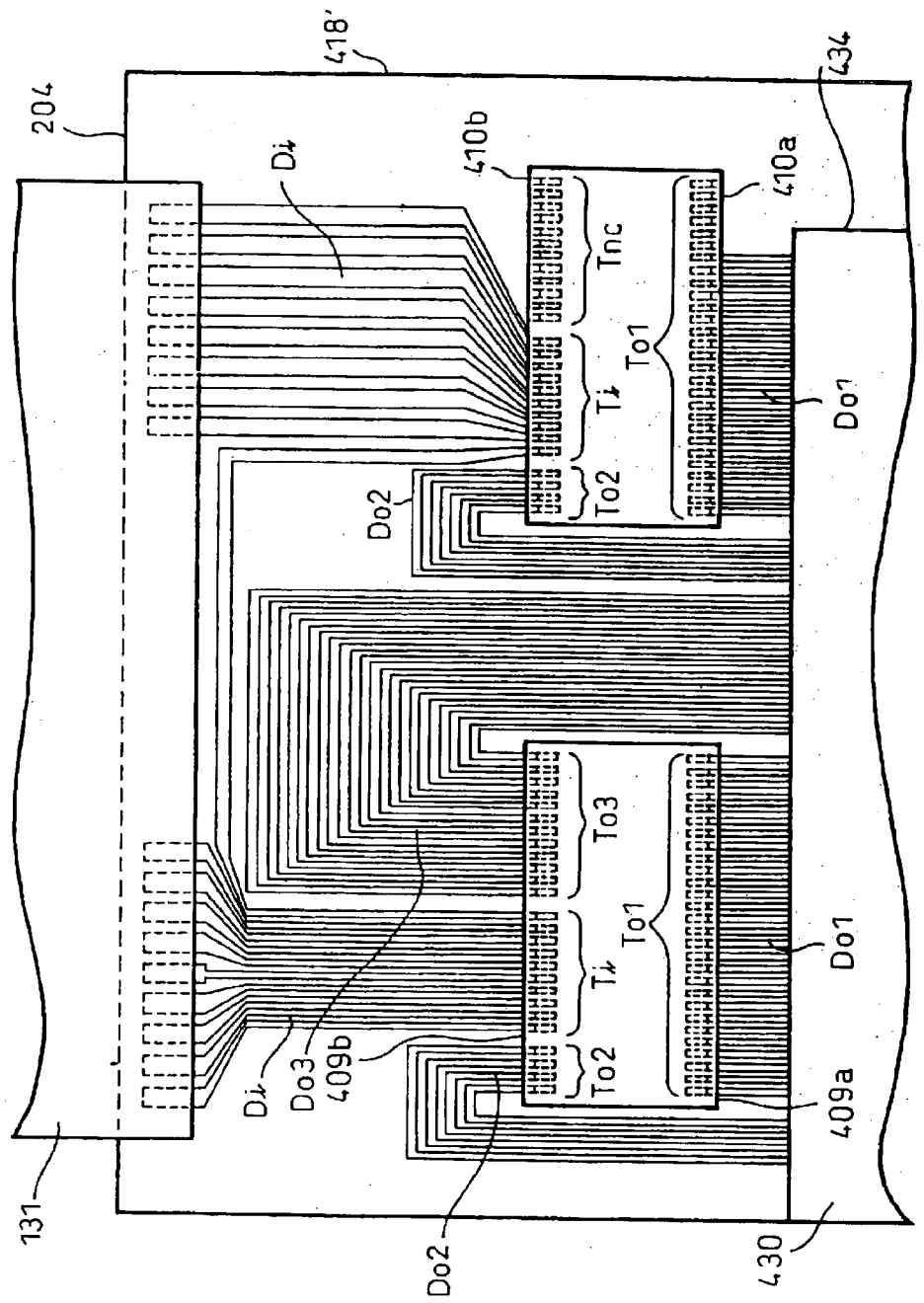
FIG. 6 is a schematic diagram for explaining the structure of another prior art liquid crystal display apparatus.

FIG. 4 is a waveform diagram showing input signal timings for continuous image display according to the present invention. In the figure, the latch signal 301 is generated in the form of a pulse for each row, and causes output signals corresponding to the data signals input into the first integrated circuit 409 and second integrated circuit 410 to be output at one time. The clock signal 302 is a signal for reading the data signals into the integrated circuits. The first to fourth data signals are signals based on which the output signals are produced; the first data signal 310, the second data signal 311, the third data signal 312, and the fourth data signal 313 together form the data signal group that defines a grayscale. The first data signal 310 is the zeroth bit signal, the second data signal 311 is the first bit signal, the third data signal 312 is the second bit signal, and the fourth data signal 313 is the third bit signal.

The first start signal 304 is a pulse signal that defines the timing for reading the data signals into the first integrated circuit 409, and goes high at a first timing 321, i.e., the first rise timing of the clock signal 302 as counted from the occurrence of the latch signal 301, the first start signal 304 directing that the reading of the data signals be started upon occurrence of a second timing 324 which is the second rise timing of the clock signal. The second start signal 305 is a pulse signal that defines the timing for reading the data signals into the second integrated circuit 410, and goes high at a third timing 322, i.e., the 35th rise timing of the clock signal as counted from the occurrence of the latch signal 301, the second start signal 305 directing that the reading of the data signals be started upon occurrence of a fourth timing 325 which is the 36th rise timing of the clock signal 302.

Thus, the first integrated circuit 409 forms outputs for the first to 35th columns of the display device as viewed from the side on which the third integrated circuit 417 is mounted, and the second integrated circuit 410 forms outputs for the 36th to 70th columns of the display device as viewed from the side on which the third integrated circuit 417 is mounted. In this way, a continuous and uninterrupted image can be displayed in the display area 134.

The present embodiment has been described by taking as an example the case where two integrated circuits are mounted, but it will be appreciated that the invention is also applicable to the case where three or more integrated circuits are mounted; in that case also, the input space can be minimized, as in the above embodiment, by making provisions to input an independent start signal to each individual integrated circuit. Further, the number of input terminals, the number of output terminals to which electrodes are connected, and the number of output terminals to which no electrodes are connected are not limited to those shown in the above embodiment. The above example has been shown for the case of the integrated circuits mounted on the data side, but the same configuration can be employed for the integrated circuits that output scanning signals. That is, by making provisions to input an independent start signal to each individual integrated circuit, the same configuration as described above can be employed for any liquid crystal display apparatus that uses a plurality of integrated circuits by connecting them together.

While the above embodiment has been described for a TFT-type liquid crystal display apparatus (the so-called active matrix type), it will be appreciated that, for a passive matrix liquid crystal display apparatus such as a super twisted nematic (STN) display apparatus, the object of the present invention can also be achieved by employing a pattern layout and start signal input method similar to those described above. Further, the integrated circuits have been described as being mounted on the first substrate 108, but it will be recognized that the invention is also applicable to the case where they are mounted on the second substrate 135 or on any other substrate forming part of the liquid crystal display apparatus.

As is apparent from the above description, according to the present invention, as the integrated circuits of the type that has not only input terminals but also output terminals on the input terminal mounted side are mounted by using a low-cost mounting method known as COG, the input space can be held to a minimum and the size of the liquid crystal display apparatus can thus be reduced; furthermore, as the electrodes can be made thinner, the resolution of the liquid crystal display apparatus can be enhanced.

What is claimed is:

1. A display apparatus in which a display device and an integrated circuit for driving said display device are mounted on the same substrate and are interconnected by electrodes formed on said substrate, and said substrate is connected to an external circuit by a flexible printed circuit, wherein said integrated circuit has a rectangular shape whose first side is provided with a first output terminal group and whose second side opposite said first side is provided with an input terminal group and a second output terminal group having output terminals, and wherein:

some but not all of the output terminals in said second output terminal group provided on said second side of said integrated circuit are designated as unconnected terminals that are not used, and an input electrode group corresponding to said input terminal group is formed in such a manner as to expand into an output electrode formation area originally reserved on said substrate for said unconnected terminals, said unconnected terminals being disposed between said input terminal group and output terminals in the second output terminal group not designated as unconnected terminals.

2. A display apparatus as claimed in claim 1, wherein said second side of said integrated circuit is further provided with a third output terminal group, and said input terminal group is disposed between said second and said third output terminal group.

3. A display apparatus as claimed in claim 2, wherein said display device is mounted on the same side as said first side of said integrated circuit on said substrate, while said flexible printed circuit is connected on the same side as said second side.

4. A display apparatus as claimed in claim 2, wherein said display device is a liquid crystal panel.

5. A display apparatus as claimed in claim 1, wherein each individual electrode in said input electrode group has a narrow-shaped portion connected to a corresponding one of the terminals in said input terminal group and a wide-shaped portion connected to a connecting electrode on said flexible printed circuit, and wherein said wide-shaped portions of individual electrodes are disposed in said expanded formation area on said substrate.

6. A display apparatus as claimed in claim 5, wherein routing electrodes for routing to said first side of said integrated circuit said second and third output terminal groups are formed on said substrate, and the wide-shaped portion of each input electrode connected to said input terminal group is formed on said substrate within a formation range of said routing electrodes on said second side of said integrated circuit.

7. A display apparatus as claimed in claim 6, wherein said display device is mounted on the same side as said first side of said integrated circuit on said substrate, while said flexible printed circuit is connected on the same side as said second side.

8. A display apparatus as claimed in claim 6, wherein said display device is a liquid crystal panel.

9. A display apparatus as claimed in claim 5, wherein said display device is mounted on the same side as said first side of said integrated circuit on said substrate, while said flexible printed circuit is connected on the same side as said second side.

10. A display apparatus as claimed in claim 5, wherein said display device is a liquid crystal panel.

11. A display apparatus as claimed in claim 1, wherein said display device is mounted on the same side as said first side of said integrated circuit on said substrate, while said flexible printed circuit is connected on the same side as said second side.

12. A display apparatus as claimed in claim 11, wherein said display device is a liquid crystal panel.

13. A display apparatus as claimed in claim 1, wherein said display device is a liquid crystal panel.

14. A display apparatus as claimed in claim 13, wherein said substrate is a glass substrate forming part of said liquid crystal panel.

15. A display apparatus as claimed in claim 1, wherein a plurality of said integrated circuits are mounted on said substrate.

16. A display apparatus as claimed in claim 15, wherein said plurality of integrated circuits each have a substantially identical terminal arrangement.

17. A display apparatus as claimed in claim 15, wherein the electrodes deposited on said substrate to connect to said terminal groups on said plurality of integrated circuits are formed in a pattern that is substantially identical between said plurality of integrated circuits.

18. A display apparatus as claimed in claim 1, wherein said display device is mounted on the same side as said first side of said integrated circuit on said substrate, while said flexible printed circuit is connected on the same side as said second side.

19. A display apparatus in which a display device and an integrated circuit for driving said display device are mounted on the same substrate and are interconnected by electrodes formed on said substrate, and said substrate is connected to an external circuit by a flexible printed circuit, wherein said integrated circuit has a first side provided with a first output terminal group and a second side opposite said first side provided with an input terminal group, a second output terminal group, and a third output terminal group, the second and third output terminal groups having output terminals, and wherein:

less than all of the output terminals in one of said second and third output terminal groups provided on said second side of said integrated circuit are designated as unconnected terminals that are not used, and an input electrode group corresponding to said input terminal group is formed In such a manner as to expand into an output electrode formation area normally reserved on said substrate for said unconnected terminals, said unconnected terminals being disposed between said input terminal group and output terminals in said one of said second and third output terminal groups not designated as unconnected terminals.

20. A display apparatus as claimed in claim 19, wherein said display device is a liquid crystal panel.

* * * * *